United States Patent
Lin

(10) Patent No.: US 8,202,133 B1
(45) Date of Patent: Jun. 19, 2012

(54) PROBE CONNECTOR

(75) Inventor: Jui-Pin Lin, New Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/089,303

(22) Filed: Apr. 18, 2011

(51) Int. Cl.
*H01R 13/24* (2006.01)

(52) U.S. Cl. ......................................................... 439/824

(58) Field of Classification Search .................. 439/824, 439/700, 482; 324/761, 754, 72.5; 320/755.05
See application file for complete search history.

(56) References Cited

U.S. PATENT DOCUMENTS

| | | | | |
|---|---|---|---|---|
| 6,340,320 B1 * | 1/2002 | Ogawa | | 439/824 |
| 6,716,043 B2 * | 4/2004 | Ishizuka | | 439/131 |
| 6,796,850 B2 * | 9/2004 | Matsui et al. | | 439/700 |
| 6,814,626 B2 * | 11/2004 | Wen-Yao | | 439/700 |
| 6,957,986 B2 * | 10/2005 | Jing | | 439/700 |
| 7,021,976 B2 * | 4/2006 | Sekiguchi | | 439/824 |
| 7,201,613 B2 * | 4/2007 | Sasaki | | 439/700 |
| 7,507,110 B1 * | 3/2009 | Yin et al. | | 439/482 |
| 7,682,206 B2 * | 3/2010 | Kainz | | 439/824 |
| 7,717,756 B1 * | 5/2010 | Yin et al. | | 439/700 |
| 7,914,348 B1 * | 3/2011 | Lin | | 439/700 |
| 7,955,140 B1 * | 6/2011 | Lin et al. | | 439/700 |
| 8,011,931 B2 * | 9/2011 | Yin et al. | | 439/38 |
| 8,066,534 B1 * | 11/2011 | Lin | | 439/700 |
| 8,066,536 B2 * | 11/2011 | Chen et al. | | 439/824 |
| 2004/0077225 A1 * | 4/2004 | Chun-Fu | | 439/700 |
| 2004/0161981 A1 * | 8/2004 | Matsui et al. | | 439/824 |
| 2004/0224571 A1 * | 11/2004 | Yeh | | 439/824 |
| 2006/0172613 A1 * | 8/2006 | Sasaki | | 439/824 |
| 2010/0248558 A1 * | 9/2010 | Yin et al. | | 439/824 |
| 2011/0195616 A1 * | 8/2011 | Chen et al. | | 439/824 |

\* cited by examiner

*Primary Examiner* — Alexander Gilman
(74) *Attorney, Agent, or Firm* — Lin & Associates IP, Inc.

(57) ABSTRACT

A probe connector includes a positioning shell having a barrel of which a bottom is sealed up by a base board and a top is opened freely, a probe pin having a connecting portion movably inserted in the barrel and a touching portion extending upward from a top of the connecting portion, an elastic element assembled between the connecting portion and the base board, and a pedestal body having an inserting space opened thereon. A top periphery edge of the barrel is shrunk inward to form a blocking eave blocking the connecting portion in the barrel, with the touching portion projecting upward out of the positioning shell. A bottom of the base board protrudes downward to form a positioning pillar. The pedestal body is removably assembled under the base board by means of the positioning pillar inserted in the inserting space.

6 Claims, 4 Drawing Sheets

PROBE CONNECTOR

BACKGROUND OF THE INVENTION

1. Field of the Invention

The present invention relates to a connector, and more particularly to a probe connector.

2. The Related Art

Referring to FIG. 1, a traditional probe connector includes a shell 10', an elastic element 30' and a probe pin 20'. The shell 10' has a cylindrical and hollow barrel 11' of which a bottom thereof is sealed up by a base board 12', and a top thereof is opened freely. When assembling the probe connector, the elastic element 30' is disposed in the barrel 11', and then a lower portion of the probe pin 20' are movably inserted in the barrel 11' with an upper portion of the probe pin 20' projecting upward out of the barrel 11', wherein the elastic element 30' is located between a bottom of the probe pin 20' and the base board 12'. Then a top periphery edge of the barrel 11' is shrunk inward by an auxiliary jig by means of extrusion-rivet technology to form a ringlike blocking eave 111' which blocks the lower portion of the probe pin 20' in the barrel 11'.

In the process of assembling the probe connector, there is a process of punching the top periphery edge of the barrel 11' inward by means of the extrusion-rivet technology to form the blocking eave 111' needed. However, because the barrel 11' of the shell 10' has an overlong length, the barrel 11' is apt to sway randomly in the process of punching the blocking eave 111'. So it is difficult to accurately process the blocking eave 111' and a bad quality of the probe connector is often caused.

SUMMARY OF THE INVENTION

An object of the present invention is to provide a probe connector. The probe connector includes a positioning shell having a hollow barrel of which a bottom is sealed up by a base board and a top is opened freely, a probe pin having a connecting portion and a touching portion protruding upward from a substantial middle of a top of the connecting portion, an elastic element and a pedestal body having a base pedestal and a positioning body extending upward from a top of the base pedestal. A bottom of the base board protrudes downward to form a positioning pillar. The connecting portion is movably inserted downward in the barrel. A periphery outside of the connecting portion abuts against a periphery inside of the barrel to realize an electrical connection between the probe pin and the positioning shell. Then a top periphery edge of the barrel is shrunk inward to form a ringlike blocking eave with a through hole in the middle thereof. The touching portion of the probe pin passes through the through hole to project upward out of the positioning shell, and the connecting portion is movably restrained in the barrel by the blocking eave. The elastic element is assembled in the barrel and between the connecting portion of the probe pin and the base board of the positioning shell, with two opposite ends thereof inserted in the connecting portion and the base board respectively. A top of the positioning body is concaved downward to form an inserting space. The positioning shell is removably assembled on the pedestal body by means of the positioning pillar inserted in the inserting space.

As described above, the probe connector of the present invention has the pedestal body capable of being removably assembled under the positioning shell. So when the probe connector has an approximately equal height to the one of a probe connector in the prior art, the height of the barrel is accordingly shortened to facilitate the blocking eave to be processed by extrusion-rivet technology. It further assures the quality of the probe connector.

BRIEF DESCRIPTION OF THE DRAWINGS

The present invention will be apparent to those skilled in the art by reading the following description thereof, with reference to the attached drawings, in which.

DETAILED DESCRIPTION OF THE PREFERRED EMBODIMENT

Figure 1:
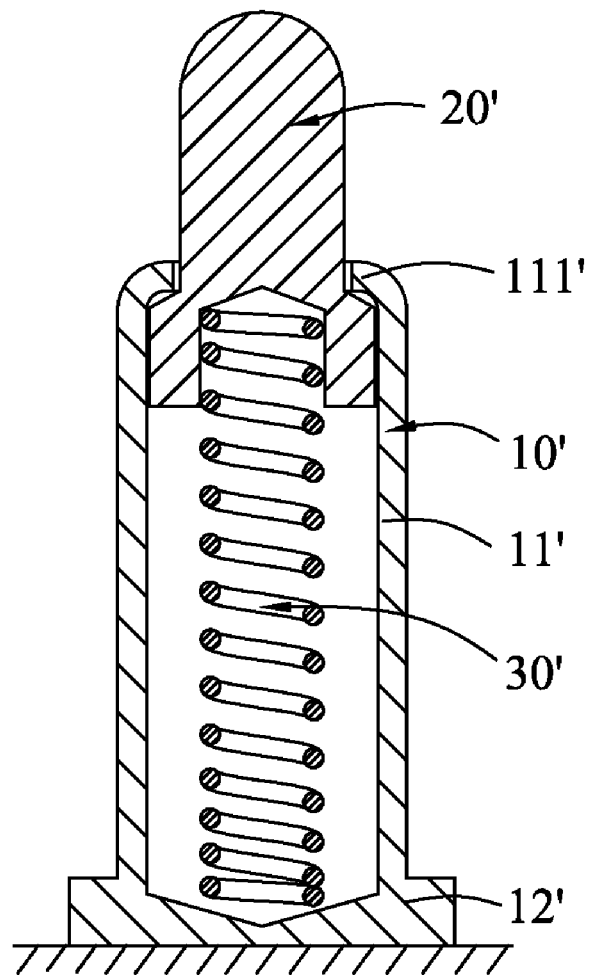
FIG. 1 is a cross-sectional view of a conventional probe connector.
Figure 2:
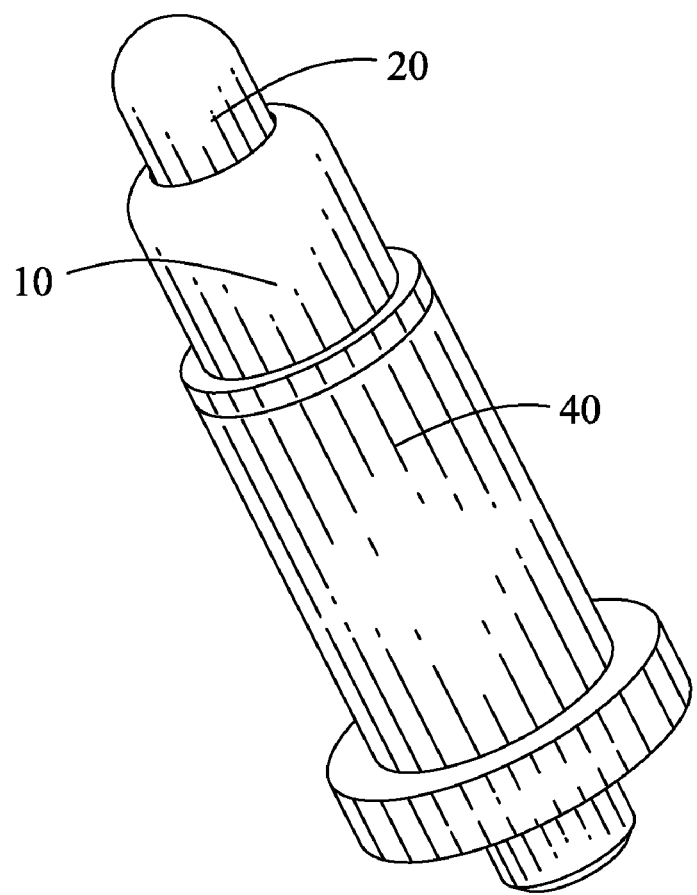
FIG. 2 is an assembled perspective view of a probe connector according to an embodiment of the present invention.
Figure 3:
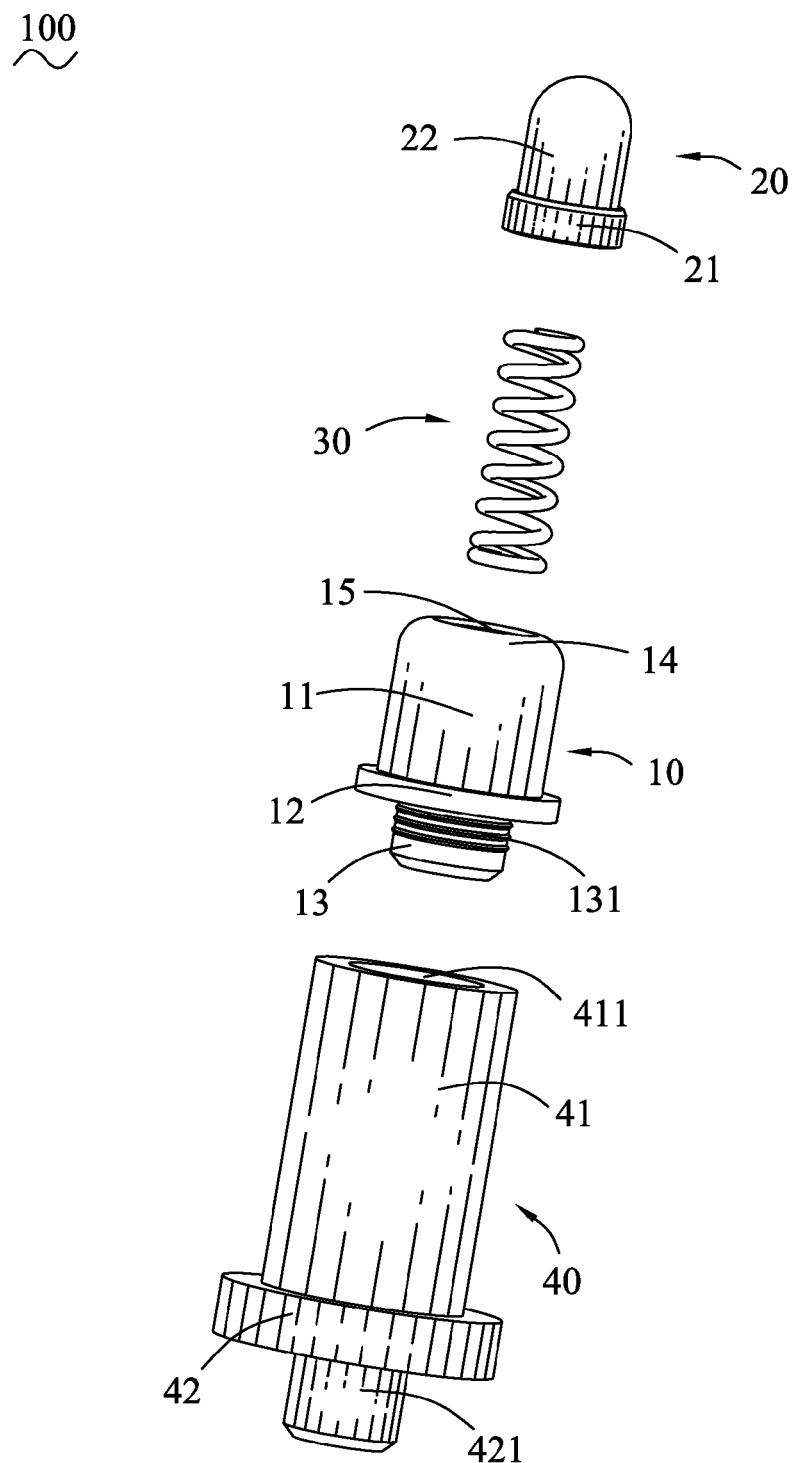
FIG. 3 is an exploded perspective view of the probe connector of FIG. 2.

With reference to FIG. 2 and FIG. 3, a probe connector 100 according to an embodiment of the present invention includes a positioning shell 10, a probe pin 20, an elastic element 30 and a pedestal body 40.

Referring to FIG. 3, the positioning shell 10 is made of metal material and has a cylindrical and hollow barrel 11 of which a bottom is sealed up by a base board 12 and a top is opened freely. A middle of a bottom of the base board 12 protrudes downward to form a positioning pillar 13 with a female screw thread 131 provided around a periphery outside of the positioning pillar 13. A top periphery edge of the barrel 11 is shrunk inward to form a ringlike blocking eave 14 with a through hole 15 in the middle thereof. In the embodiment, the elastic element 30 is a spring.

Figure 4:
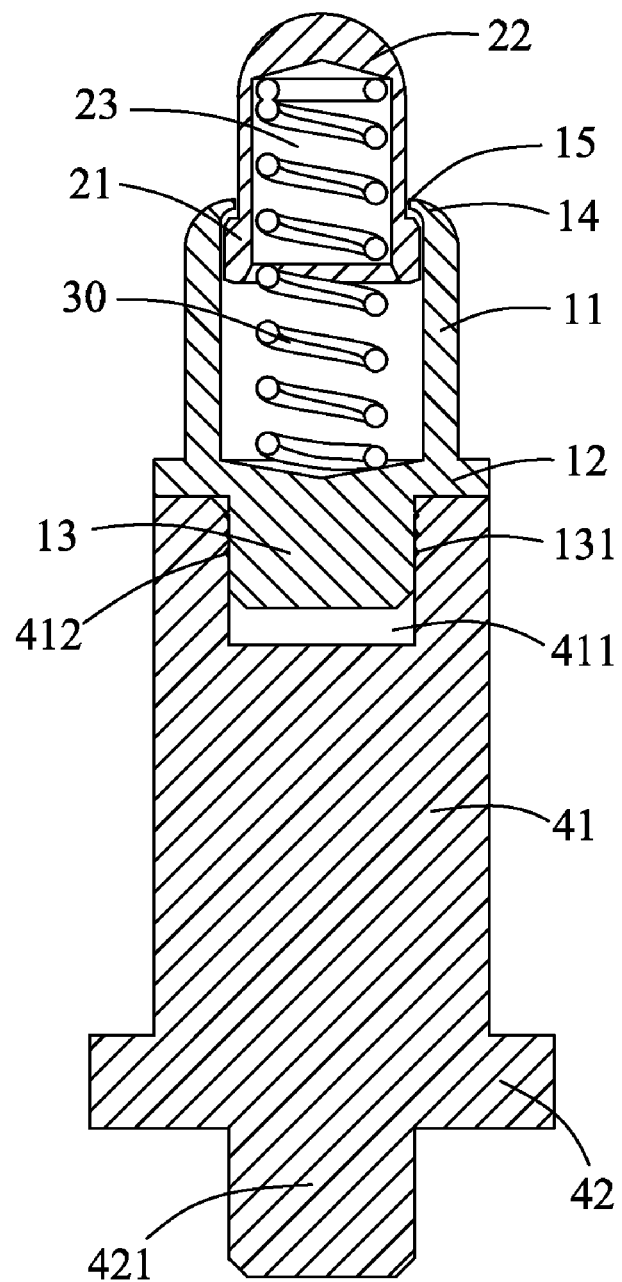
FIG. 4 is a cross-sectional view of the probe connector of FIG. 2.

Referring to FIG. 3 and FIG. 4, the probe pin 20 has a columned connecting portion 21 and a touching portion 22 protruding upward from a middle of a top of the connecting portion 21. The connecting portion 21 has an outside diameter corresponding to an inside diameter of the barrel 11, and the touching portion 22 has an outside diameter corresponding to a diameter of the through hole 15. A bottom of the connecting portion 21 is concaved upward to form a cylindrical receiving chamber 23 further spread upward to the touching portion 22. The receiving chamber 23 is coaxial with the connecting portion 21 and the touching portion 22.

Referring to FIG. 3 and FIG. 4 again, the pedestal body 40 has a base pedestal 42 of circular board shape, and a columned positioning body 41 extending upward from a middle of a top of the base pedestal 42. A top of the positioning body 41 is concaved downward to form a cylindrical inserting space 411 having a diameter corresponding to an outside diameter of the positioning pillar 13. In this embodiment, the inserting space 411 is coaxial with the positioning body 41. A periphery inside of the inserting space 411 is provided with a male screw thread 412 thereon. A middle of a bottom of the base pedestal 42 protrudes downward to form a pillar portion 421 capable of being designed according to different requirements.

Referring to FIGS. 2-4 again, when assembling the probe connector 100, the elastic element 30 is inserted downward in the barrel 11 of the positioning shell 10 with a bottom end thereof resisting against the base board 12. Then the connecting portion 21 of the probe pin 20 is movably inserted downward in the barrel 11, with a top end of the elastic element 30 being received in the receiving chamber 23 and abutting against a top side of the receiving chamber 23. A periphery outside of the connecting portion 21 abuts against a periphery inside of the barrel 11 to realize an electrical connection between the probe pin 20 and the positioning shell 10. Then the top periphery edge of the barrel 11 is shrunk inward by means of the extrusion-rivet technology to form the blocking eave 14 blocking the connecting portion 21 in the barrel 11. The touching portion 22 of the probe pin 20 passes through the through hole 15 to project upward out of the positioning shell 10. The positioning shell 10 is removably screwed to the pedestal body 40 by means of the positioning pillar 13 inserted into the inserting space 411 and the male screw thread 412 engaged with the female screw thread 131.

As described above, the probe connector 100 of the present invention has the pedestal body 40 capable of being removably assembled under the positioning shell 10. So when the probe connector 100 has an approximately equal height to the one of a probe connector in the prior art, the height of the barrel 11 is accordingly shortened to facilitate the blocking eave 14 to be processed by the extrusion-rivet technology. It further assures the quality of the probe connector 100.

The foregoing description of the present invention has been presented for the purposes of illustration and description. It is not intended to be exhaustive or to limit the invention to the precise form disclosed, and obviously many modifications and variations are possible in light of the above teaching. For example, the receiving chamber 23 may be opened in the base board 12 and further spread downward to the positioning pillar 13 for receiving the bottom end of the elastic element 30 therein. Such modifications and variations that may be apparent to those skilled in the art are intended to be included within the scope of this invention as defined by the accompanying claims.

What is claimed is:

1. A probe connector, comprising:
   a positioning shell having a hollow barrel of which a bottom is sealed up by a base board and a top is opened freely, a bottom of the base board protruding downward to form a positioning pillar;
   a probe pin having a connecting portion and a touching portion protruding upward from a substantial middle of a top of the connecting portion, the connecting portion being movably inserted downward in the barrel, a periphery outside of the connecting portion abutting against a periphery inside of the barrel to realize an electrical connection between the probe pin and the positioning shell, then a top periphery edge of the barrel being shrunk inward to form a ringlike blocking eave with a through hole in the middle thereof, wherein the touching portion of the probe pin passes through the through hole to project upward out of the positioning shell, and the connecting portion is movably restrained in the barrel by the blocking eave;
   an elastic element assembled in the barrel and between the connecting portion of the probe pin and the base board of the positioning shell, with two opposite ends thereof inserted in the connecting portion and the base board respectively; and
   a pedestal body having a base pedestal and a positioning body extending upward from a top of the base pedestal, a top of the positioning body being concaved downward to form an inserting space, the positioning shell being removably assembled on the pedestal body by means of the positioning pillar inserted in the inserting space.

2. The probe connector as claimed in claim 1, wherein a female screw thread is provided around a periphery outside of the positioning pillar, a periphery inside of the inserting space is provided with a male screw thread thereon, the positioning pillar is screwed into the inserting space by means of the male screw thread engaged with the female screw thread.

3. The probe connector as claimed in claim 1, wherein a bottom of the connecting portion is concaved upward to form a receiving chamber further spread upward to the touching portion for receiving a top end of the elastic element therein.

4. The probe connector as claimed in claim 1, wherein a top of the base board is concaved downward to form a receiving chamber further spread downward to the positioning pillar for receiving a bottom end of the elastic element therein.

5. The probe connector as claimed in claim 1, wherein the elastic element is a spring.

6. The probe connector as claimed in claim 1, wherein a bottom of the base pedestal protrudes downward to form a pillar portion.

* * * * *